United States Patent [19]

Potts et al.

[11] Patent Number: 4,902,601
[45] Date of Patent: Feb. 20, 1990

[54] RADIATION SENSITIVE POLYMERIC DIAZONIUM SALT AND METHODS OF MAKING THE POLYMERIC DIAZONIUM SALT

[75] Inventors: Rodney M. Potts, Adel; Michael J. Pratt, Menston; Keith M. Fletcher, Oakwood, all of England

[73] Assignee: Vickers PLC, London, England

[21] Appl. No.: 300,699

[22] Filed: Jan. 19, 1989

Related U.S. Application Data

[63] Continuation of Ser. No. 13,497, Feb. 11, 1987, abandoned.

[30] Foreign Application Priority Data

Feb. 12, 1986 [GB] United Kingdom ............... 8603405

[51] Int. Cl.$^4$ ............. G03C 1/54; C07C 113/00; C08F 18/22; C08F 20/34
[52] U.S. Cl. ................... 430/175; 430/302; 525/328.4; 525/337; 525/340; 525/353; 525/374; 534/561; 534/565; 522/32
[58] Field of Search ............. 430/175, 194, 197, 302; 534/561, 565; 525/328.4, 337, 340, 353, 374; 522/32

[56] References Cited

U.S. PATENT DOCUMENTS

| | | | |
|---|---|---|---|
| 3,174,860 | 3/1965 | Sus et al. | 430/175 |
| 4,581,313 | 4/1986 | Minamizoho et al. | 430/175 |
| 4,595,648 | 6/1986 | Stanton et al. | 430/162 |
| 4,666,993 | 5/1987 | Urano et al. | 525/328.2 |

FOREIGN PATENT DOCUMENTS

| | | | |
|---|---|---|---|
| 58-127923 | 7/1983 | Japan | 430/175 |
| 2018779 | 10/1979 | United Kingdom | 430/195 |

*Primary Examiner*—Charles L. Bowers, Jr.
*Attorney, Agent, or Firm*—Armstrong, Nikaido, Marmelstein, Kubovcik & Murray

[57] ABSTRACT

Radiation sensitive material suitable for the production of radiation sensitive plates for lithographic printing plate manufacture is based on a polymer including a plurality of structural units represented by the formula:

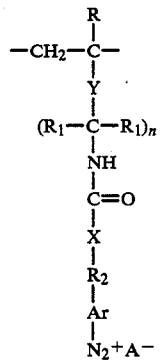

in which, R represents H or CH$_3$; each R$_1$, which may be the same or different represents H or alkyl; R$_2$ represents a single bond or a substituted or unsubstituted divalent radical; Ar represents a substituted or unsubstituted divalent radical derived from an aromatic or heteroaromatic compound; X represents O, S or NH; A represents an anion; Y represents a carbonyl oxy or aromatic radical; and n is an integer equal to or greater than 1.

10 Claims, No Drawings

RADIATION SENSITIVE POLYMERIC DIAZONIUM SALT AND METHODS OF MAKING THE POLYMERIC DIAZONIUM SALT

This is a continuation of Ser. No. 013,497, filed 2/11/87, now abandoned.

This invention relates to radiation sensitive materials suitable for use in the manufacture of photoresists, and more particularly lithographic printing plates.

Such radiation sensitive materials have to satisfy various parameters. Thus they should be as sensitive as possible to radiation, be soluble in a suitable coating solvent, be stable when coated on a substrate and stored for long periods, have good solubility difference (in a developer which is preferably aqueous-based) between the unexposed and exposed states, adhere well to the substrate, and be oleophilic and tough in the image forming areas.

Most materials are a compromise as the parameters tend to be mutually exclusive. Thus, for example, a highly sensitive material is more likely to be unstable.

Constant efforts are, therefore, being made to find materials which are a better compromise or which have improved properties in certain respects.

Diazo materials are well known to satisfy many of the above parameters and their use is well documented in the patent literature. Reference may be made to GB Patent Specifications Nos. 954 761, 1 019 919, 1 023 589, 1 055 079, 1 302 717, 1 312 925 and 1 388 038 and to European Patent Specification No. 30862.

In this last specification, there is disclosed a material comprising a polymer having diazo group containing side chains.

It has now been discovered that materials having superior qualities may be obtained by using polymers derived from an isocyanato alkyl (meth)acrylate of the type

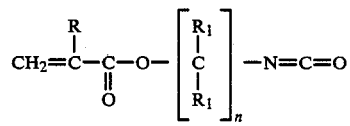

or an alkenyl phenylene alkylene isocyanate of the type

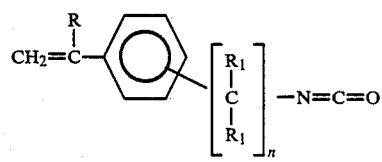

wherein R, $R_1$ and n have the meanings set out below.

According to one aspect of the present invention there is provided a radiation sensitive compound which comprises a polymer including a plurality of structural units represented by the formula:

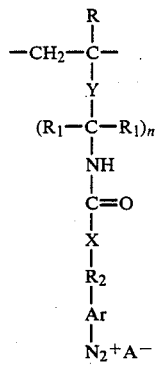

in which, R represents H or $CH_3$; each $R_1$, which may be the same or different represents H or alkyl; $R_2$ represents a single bond or a substituted or unsubstituted divalent radical; Ar represents a substituted or unsubstituted divalent radical derived from an aromatic or heteroaromatic compound; X represents O, S or NH; A represents an anion; Y represents a carbonyl oxy or aromatic radical; and n is an integer greater than or equal to 1.

$R_2$ and Ar may be any of the radicals specified in EP-A-30862 under the designation R and Ar, respectively.

Thus for example Ar may be phenylene, naphthylene or benzothiazolylene. It may include substituent groups such as alkyl, aryl, alkoxy, aryloxy, dialkylamino, arylmercapto, halogeno, nitro or carboxy. The substituent may confer extra light sensitivity. For example, it may be or may contain a diazo, azido or styryl group. Advantages in terms of stability and light sensitivity are conferred by a substituent amino or arylmercapto group in the para position to the main diazo group. The stability may be further increased by introduction of an additional substituent, such as an alkoxy group, ortho to the diazo group. The radical $R_2$ may be, for example, substituted or unsubstituted alkylene, arylene, or a combination thereof. The radical may contain one or more heteroatoms providing groupings such as are shown by formulae 2 to 11. The radical $R_2$ may contain one or more diazo groups and may be typified by the structure

$$-NR_3CH_2CH_2-$$

where $R_3$ provides a link with moieties containing the other diazo group in which case it may be ethylene, phenylene, succinoyl bis oxy ethyl, methylidene amino or N,N-2,4-toluene bis carbamoyloxyethyl or it may be a single bond when the moiety is a p-diazophenyl group.

The anion $A^-$ may be p-toluene sulphonate, naphthalene sulphonate, dodecyl benzene sodium sulphonate, dicyclohexylsulphosuccinate, di octyl sulphosuccinate, triisopropyl naphthalene sulphonate, diisobutyl naphthalene sulphonate 2-hydroxy 4 methoxy benzophenone-5-sulphonate, mesitylene sulphonate, octyl phenyl sulphonate, lauryl sulphate, naphthoate, cinnamate, tetrafluoroborate, hexafluorophosphate or reineckate.

According to a further aspect of the present invention, the polymer may include units derived from one or more monomeric compounds containing an unsaturated group.

Examples of such monomeric compounds include any mono (meth)acrylate, (meth)acrylamide, maleic anhydride, allyl compound, vinyl compound, styrene compound, acrylonitrile compound, itaconate, or crotonate.

Preferably said monomeric compounds are selected from methyl (meth)acrylate, lauryl (meth)acrylate, stearyl (meth)acrylate, butyl (meth)acrylate, (meth)acrylic acid or an isocyanato alkyl (meth)acrylate, the isocyanato group of which has been reacted with a compound which may be selected to enhance the properties of the final product, for example, increased solubility, increased oleophilicity or increased strength. This enhancing compound may be, for example, an alcohol, a phenol, an aromatic or aliphatic amine, or a mercapto compound.

The compounds of the invention may be prepared by:
(i) polymerising a compound of the formula

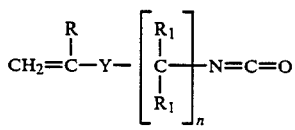

(ii) reacting the isocyanate groups of the resulting polymer with a compound containing a diazo group or diazo group precursor and an —OH, —SH, or —NH$_2$ group,
(iii) converting the diazo group precursors as necessary into diazo groups, and
(iv) reacting the diazo groups with an acid of the formula HA or with a salt of such acid.

According to a preferred method, the compound of step (i) is co-polymerised with one or more monomer compounds containing an unsaturated group and no hydroxy or amino functionality.

According to another preferred method in step (ii) the homopolymer or copolymer is reacted additionally with a compound which has a group capable of reacting with the isocyanate groups of the polymer and which enhances the property of the final product as referred to above.

Alternatively, the compounds of the invention may be prepared by
(i) reacting a compound of the formula

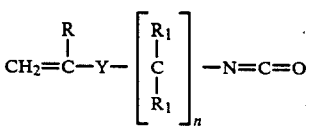

with a compound containing a diazo group or diazo group precursor and an —OH, —SH, or NH$_2$ group,
(ii) polymerising the resulting compound,
(iii) converting the diazo group precursors as necessary into diazo groups, and
(iv) reacting the diazo groups with an acid of the formula HA or a salt of such an acid.

According to a preferred method, the product of step (i) is copolymerised with one or more compounds containing an unsaturated group.

The use of a compound containing a diazo group precursor, i.e. a group capable of being converted to a diazo group, is preferred because there is a risk of diazo decomposition during the reaction.

Examples of suitable compounds containing a diazo precursor are:
(1) protected amines such a p-(N-ethyl-N-hydroxyethyl) amino acetanilide; 2,5-diethoxy-4-aminoacetanilide; and 6-chloracetyl-amino-5-methoxy-2-mercaptobenzothiazole,
(2) nitro compounds such as 2,5-dimethoxy-4-nitroaniline and 2-bromo-6-hydroxy ethoxy-4-nitro-N, N-dipropylaniline, and
(3) azo compounds such as 4-phenylazo-1-naphthyl amine and 4-[N,N-Bis($\beta$-hydroxyethyl) amino]azobenzene.

The following Examples illustrate the invention:

EXAMPLE 1

A. Homopolymerisation of Monomer

N-methyl pyrrolidone (NMP) (60 ml), which had been dried over molecular sieves, was introduced into a polymerisation flask and was heated to 95° C., under a slow stream of nitrogen, by means of a thermostatically-controlled oil bath. Constant speed stirring was maintained throughout the polymerisation. When a steady temperature had been attained, a solution of isocyanatoethyl methacrylate (IEM) (15.8 g) and azobisisobutyronitrile (AIBN) (0.79 g) in NMP (9.9 g) was added dropwise over 2 hours. On completion of the addition, the solution was stirred at 95° C. for a further 2 hours and the resultant poly(IEM) solution was cooled to room temperature.

Retention of isocyanate groups was 85–90%. Weight average molecular weights of the homopolymers (methanol adducts) were 20,000–25,000 measured by GPC (gel permeation chromatography) using a poly-(IEM)-methanol standard.

B. Reaction of Homopolymer with Diazo Precursor p-(N-ethyl-N-hydroxyethyl)aminoacetanilide (EHAA) (26.2 g) was dissolved in NMP (100 ml) and two drops of dibutyl tin dilaurate were added. To this solution, at room temperature, was added the poly-(IEM) solution Stirring was continued until IR (infra red) spectroscopy showed that no free isocyanate remained (about 2 hours)

To a refluxing solution of conc. H$_2$SO$_4$ (40 g) in water (200 ml) (approx. 2M) was added the above polymer solution, maintaining reflux for the duration of the addition and for a further 2½ hours to hydrolyse the polymer. During this time the solution became dark in colour.

C. Introduction of Diazo Group

The hydrolysed polymer solution was cooled to below 5° C. (ice-water bath) and a solution of sodium nitrite (8.3 g) in water (40 ml) was added portionwise, keeping the temperature below 5° C. The mixture was stirred for 1 hour at 1°–2° C., and then excess nitrite was destroyed by the addition of the necessary amount of sulphamic acid.

D. Ion Exchange

A di-isobutyl naphthalene-1-sulphonic acid (DBSA) paste (68 g) was dissolved in water (3 liters) and the diazo polymer solution was poured in slowly with vigorous stirring. The precipitated polymer was collected by filtration, washed with copious amounts of cold water and dried in vacuo at room temperature.

EXAMPLE 2

Example 1 was repeated except that instead of EHAA in Stage B, 2,5-diethoxy-4-amino-acetanilide (28.1 g) and 6-chloracetylamino-5-methoxy-2-mercaptobenzothiazole (34.0 g) respectively were used. The resultant compounds had similar properties to those of the compound of Example 1.

EXAMPLE 3

A. Reaction of IEM Monomer with Diazo Precursor

EHAA (43 g) and dibutyl tin dilaurate (4 drops) were dissolved in NMP (88 ml). To this solution, IEM (25 g) was added over 15 min. with stirring, the temperature being maintained at 20° C. Stirring was continued until IR spectroscopy showed that no free isocyanate remained (about 2 hours).

B. Polymerisation

A 56 ml portion of the IEM-EHAA solution obtained from Stage A was diluted with NMP (15 ml) and was heated to 95° C. under nitrogen. A solution of AIBN (0.1 g) in NMP (5 ml) was added over 5 min., and then the mixture was stirred for 4 hours. A further charge of AIBN (0.1 g) in NMP (5 ml) was made and stirring was continued for a further 2 hours.

The resultant polymer solution was added to refluxing conc. $H_2SO_4$ (24 ml) in water (200 ml). Reflux was maintained for 2 hours and the resultant hydrolysed solution was cooled.

C. Introduction of Diazo Group

The hydrolysed polymer solution was cooled further, in a flask, by the addition of ice (300 g). With the flask immersed in an ice bath, a solution of sodium nitrite (5.3 g) in water (25 ml) was added with stirring. After 1 hour at 0°–3° C., excess nitrite was destroyed with sulphamic acid.

D. Ion Exchange

To a solution of DBSA (50 g) in water (2.5 liters) was added the diazo solution obtained from Stage C with vigorous stirring. The precipitate was collected by filtration, washed with copious amounts of cold water and dried in vacuo. Yield 27 g.

EXAMPLE 4

A. Preparation of Terpolymer

NMP (60 ml) was heated to 95° C. (oil bath) under a nitrogen atmosphere and a solution containing methyl methacrylate (7.0 g), IEM (3.1 g), lauryl methacrylate (2.5 g), AIBN (0.78 g) and NMP (10.9 ml) was added dropwise over 2 hours. A further 2 hour period at 95° C. was allowed after completing the additions. The polymer solution was then cooled to 20° C. The weight average molecular weight of the terpolymer was 4400 measured by GPC using a polystyrene standard

B. Reaction of Terpolymer with Diazo Precursor

EHAA (5.2 g) was dissolved in NMP (20 ml) and 1 drop of dibutyl tin dilaurate added. To this solution at room temperature, was added the polymer solution After 1 hour, IR spectroscopy showed that a small amount of isocyanate was still present, so stirring was continued for a further hour, and the mixture allowed to stand overnight.

The polymer solution was added slowly to a refluxing solution of $H_2SO_4$ (8 g) in water (50 ml) in a flask. After initial frothing and the precipitation of some solid, a clear solution formed which gradually became dark in colour. Refluxing was continued for 2½ hours, the temperature varying between 95°–105° C., and then the flask was cooled to room temperature.

Samples of the terpolymer before and after hydrolysis were isolated. IR and NMR spectroscopy showed that there had been no hydrolysis of the methacrylate groups.

C. Introduction of Diazo Group

The polymer solution was cooled by the addition of ice (100 g), and then immersed in an ice bath. With the temperature at 0° C., sodium nitrite (1.66 g) in water (8 ml) was added with stirring. After 1 hour, excess nitrite was destroyed by the addition of sulphamic acid.

D. Ion Exchange

DBSA paste (14.5 g) was dissolved in water (750 ml) and cooled to 10° C. The diazo solution obtained from Stage C was slowly poured in (1–2 min.), and after warming gradually to 25° C., the polymer coagulated. It was allowed to settle, collected by filtration, and washed with 2 liters of cold (10° C.) water. A light brown powder was obtained which was dried in a vacuum desiccator for three days. Yield 16.3 g.

EXAMPLE 5

A. Reaction of IEM Monomer with Diazo Precursor

EHAA (34.4 g) and dibutyl tin dilaurate (3 drops) were dissolved in NMP (35 ml). To this solution, IEM (20 g) was slowly added with stirring, whilst maintaining the temperature at 20°–25° C. Stirring was continued until no free isocyanate remained (about 2–3 hours). The reaction mixture was then diluted with NMP to a total volume of 120 ml.

B. Copolymerisation

A portion of the above solution (22.8 ml) was mixed with methyl methacrylate (10.6 g), lauryl methacrylate (4.14 g), methacrylic acid (1.4 g), AIBN (0.1 g) and NMP (25 ml). The mixture was heated to 70° C. under a nitrogen atmosphere and stirred for 4 hours. A further charge of AIBN (0.2 g) in NMP (20 ml) was made and then the mixture was heated to 80° C. for 1½ hours.

The resulting copolymer solution was refluxed with a mixture of conc. $H_2SO_4$ (14 ml), water (85 ml) and NMP (100 ml) for 3 hours. The mixture was then cooled below 5° C. by the addition of ice-water (900 g). IR and NMR spectroscopy again showed that there had been no hydrolysis of the methacrylate groups.

C. Introduction of Diazo Group

A solution of sodium nitrite (2.6 g) in water (13 ml) was added to the hydrolysed copolymer solution and stirred for 1 hour at 0°–5° C. Excess nitrite was then destroyed with sulphamic acid.

D. Ion Exchange

The diazotised copolymer solution was poured into a solution of DBSA paste (21.3 g) in water (1000 ml) at 10° C. with vigorous stirring. The precipitate was allowed to coagulate at 40° C. and then was collected by filtration, washed with copious amounts of water (10° C.) and dried in vacuo. Yield 20 g.

EXAMPLE 6

A. Preparation of Terpolymer

NMP (50 ml) was heated to 95° C. (oil bath), under an atmosphere of nitrogen, and a solution containing methyl methacrylate (6.0 g), IEM (4.7 g), lauryl methacrylate (2.5 g) and AIBN (0.78 g) in NMP (10.5 ml) was added dropwise over 2 hours. The solution was then stirred at 95° C. for a further 2 hours, and was then cooled to room temperature.

B. Reaction of Terpolymer with Diazo Precursor and Amino-Acid

EHAA (4.0 g), sufficient to react with ⅔ of the available isocyanate groups in the terpolymer, was dissolved in NMP (15 ml) and 1 drop of dibutyl tin dilaurate was added. The terpolymer solution was added to this solution, at room temperature, and the mixture was stirred for 1½ hours. In order to effect conversion of the remaining isocyanate groups, a solution of 4-aminophenylacetic acid sodium salt (1.7 g) in NMP (10 ml) was added quickly and the mixture was stirred at 40°–50° C. for 2 hours.

The polymer solution was added to a refluxing solution of conc. $H_2SO_4$ (12 g) in water (75 ml) over 5 min. Reflux was maintained for a further 2½ hours to effect hydrolysis.

C. Introduction of Diazo Group

The hydrolysed polymer solution was cooled by the addition of ice (10 g) and was then immersed in an ice bath. With the temperature at 0°–3° C., sodium nitrite (1.66 g) in water (8 ml) was added with stirring. After 1 hour, excess nitrite was destroyed by the addition of sulphamic acid.

D. Ion Exchange

Same as Example 3. Yield 19.9 g.

EXAMPLE 7

Preparation and Processing of Printing Plates

Solutions containing radiation sensitive material based on various diazo polymers formed from EHAA and the monomers set out in the following Table were made up as follows:
Diazo polymer: 3.00 g
Flexo Blue 810: 0.06 g
Methyl ethyl ketone: 100 ml The solutions were whirler coated onto grained and anodised aluminium and the resulting radiation sensitive plates were dried in an oven at 100° C. for 2 min. The plates were then imagewise exposed beneath a continuous tone step-wedge in a vacuum frame and developed with an aqueous solution containing 10% anionic surfactant and 2% benzyl alcohol to obtain lithographic printing plates.

The results are shown in the following Table.

TABLE

| Polymer No. | Prepd. as in Example | Ratio of monomers in polymer | | | | | Step-wedge reading | |
|---|---|---|---|---|---|---|---|---|
| | | IEM | MM | MAA | LM | SM | Solid | Clear |
| 1 | 1 | 1 | — | — | — | — | 14 | 18 |
| 2 | 3 | 1 | — | — | — | — | 13 | 18 |
| 3 | 5 | 1 | 2 | — | — | — | 9 | 19 |
| 4 | 5 | 1 | — | — | 1 | — | 8 | 18 |
| 5 | 5 | 5 | — | — | — | 1 | 13 | 19 |
| 6 | 5 | 1 | 2 | — | 2 | — | 11 | 17 |
| 7 | 5 | 1 | 2 | — | 1 | — | 7 | 15 |
| 8 | 4 | 2 | 7 | — | 1 | — | 5 | 15 |
| 9 | 4 | 3 | 6 | — | 1 | — | 3 | 12 |
| 10 | 5 | 1 | — | 2 | 2 | — | 6 | 12 |
| 11 | 5 | 1 | 4 | 1 | 1 | — | 5 | 14 |
| 12 | 5 | 1 | 7 | 1 | 1 | — | 6 | 14 |
| 13 | 5 | 2 | 3 | 1 | 4 | — | 7 | 15 |
| 14 | 6 | 3 | 6 | — | 1 | — | 3 | 12 |

In the above table, IEM is isocyanato ethyl methacrylate, MM is methyl methacrylate, MAA is methacrylic acid, LM is lauryl methacrylate and SM is stearyl methacrylate.

Polymers containing pendant carboxylic acid groups (Nos. 10–14) showed improved development characteristics when incorporated in printing plates. (The carboxylic acid groups in polymer No. 14 are derived from the amino acid used in Stage B) When an aqueous solution of 20% anionic surfactant was used as a developer, polymer No. 8 gave a plate which showed a residual stain after development. However, polymer No. 14 afforded a plate which showed no residual stain. The diazo content of the two polymers, taken as the UV absorbance of a 0.002% w/v solution at 380 nm, was the same (0.43), but polymer No. 14 contained additional carboxylic acid groups.

EXAMPLE 8

A. Homopolymerisation of Monomer

Meta-isopropenyl -α,α-dimethyl benzyl isocyanate (m-TMI) monomer was dried by distillation over calcium hydride under nitrogen in vacuo immediately before use. Methylene chloride was refluxed over $P_2O_5$ for 1 hour, and then was distilled.

To a pre-dried flask were charged m-TMI (21.0 g) and methylene chloride (100 ml), flushing with nitrogen being effected during the addition. The flask was then immersed in a dry ice—methanol bath at −28° C. and conc. $H_2SO_4$ was added to initiate the polymerisation. After 3 hours the polymer solution was allowed to warm up to room temperature and the solvent was evaporated.

B. Reaction of Homopolymer with Diazo Precursor

The polymer obtained in Stage A was redissolved in dry NMP (60 ml) and was added to a solution of p-(N-ethyl-N-hydroxyethyl)aminoacetanilide (EHAA) (26.2 g) in NMP (100 ml). The mixture was heated to 50° C. with stirring. The temperature was maintained until IR spectroscopy showed that no free isocyanate remained (4–5 hours).

To a refluxing solution of conc. $H_2SO_4$ (40 g) in water (200 ml) was added the polymer solution Refluxing was maintained for the duration of the addition and then for a further 2½ hours to cause hydrolysis of the amide groups attached to the polymer.

C. Introduction of Diazo Group

The hydrolysed polymer solution was cooled below 5° C. (ice-water bath) and a solution of sodium nitrite (8.3 g) in water (40 ml) was added. The mixture was stirred for 1 hour at 1°–2° C., and then excess nitrite was destroyed by the addition of sulphamic acid.

D. Ion Exchange

Di-isobutyl naphthalene-1-sulphonic acid (DBSA) paste (68 g) was dissolved in water (3 liters) and the diazo polymer solution from Stage C was poured in slowly with vigorous stirring. The precipitated polymer was collected by filtration, washed thoroughly with cold water and dried in vacuo at room temperature.

EXAMPLE 9

Example 8 was repeated except that instead of EHAA in Stage B, 2,5-diethoxy-4-amino-acetanilide (28.1 g) and 6-chloroacetylamino-5-methoxy-2-mercaptobenzo thiazole (34.0 g) respectively were used. The resultant compounds had similar properties to those of the compound of Example 8.

EXAMPLE 10

A. Reaction of m-TMI Monomer with Diazo Precursor

EHAA (43 g) and dibutyl tin dilaurate (4 drops) were dissolved in NMP (88 ml). To this solution, m-TMI (33.2 g) was added slowly with stirring. Then the mixture was heated to 50° C. Stirring was continued until IR spectroscopy showed that no free isocyanate remained (3-4 hours). The solution was then cooled, poured into cold water (500 ml) and extracted with methylene chloride (250 ml). After washing with water, the organic extract was dried (anhydrous $Na_2SO_4$) and the solvent was removed under reduced pressure. The resultant solid was recrystallised from 95% ethanol and dried in vacuo at 50° C.

B. Polymerisation

To a pre-dried flask were charged m-TMI-EHAA adduct (product from Stage A) (43.6 g) and methylene chloride, dried as described in Example 8. (150 ml), flushing with nitrogen being carried during the addition. The flask was then immersed in a dry ice—methanol bath at −78° C. and conc. $H_2SO_4$ (0.08 ml) was added to initiate the polymerisation. After 3 hours the polymer solution was allowed to warm up to room temperature and the solvent was evaporated.

The resultant polymer was redissolved in NMP (150 ml) and the solution was added slowly to a refluxing solution of conc. $H_2SO_4$ (40 g) in water (200 ml). The mixture was boiled for 2½ hours and was then cooled to room temperature.

C. Introduction of Diazo Group

The hydrolysed polymer solution from Stage B was cooled below 5° C. (ice-water bath) and a solution of sodium nitrite (8.3 g) in water (40 ml) was added. The mixture was stirred for 1 hour at 1°-2° C. and then excess nitrite was destroyed by addition of sulphamic acid.

D. Ion Exchange

DBSA paste (68 g) was dissolved in water (3 l) and the diazo polymer solution was poured in slowly with vigorous stirring. The precipitated polymer was collected by filtration, washed thoroughly with cold water and dried in vacuo at room temperature.

EXAMPLE 11

A. Preparation of Terpolymer

NMP (1 l), dried over molecular sieves, was heated to 95° C. (oil bath) under a nitrogen atmosphere and a solution containing methyl methacrylate (140.0 g), m-TMI (80.4 g), lauryl methacrylate (50.8 g), AIBN (15 g) and NMP (200 ml) was added dropwise over 2 hours. A further 3 hour period at 95° C. was allowed after completing the additions. The polymer solution was then cooled to 20° C.

B. Reaction of Terpolymer with Diazo Precursor

EHAA (97.7 g) was dissolved in NMP (375 ml) and dibutyl tin dilaurate (0.5 ml) was added. To this solution, at room temperature, was added the polymer solution from Stage A. The mixture was stirred at 50° C. for 5 hours, after which time IR spectroscopy showed that all of the isocyanate had reacted.

The polymer solution was added slowly to a refluxing solution of $H_2SO_4$ (87 ml) in water (1). A dark coloured solution gradually formed and refluxing was continued for 2½ hours. The reaction mixture was then cooled to room temperature.

Samples of the terpolymer before and after hydrolysis were isolated. IR and NMR spectroscopy showed that there had been no hydrolysis of the ester groups of the methacrylate comonomers.

C. Introduction of Diazo Group

The hydrolysed polymer solution from Stage B was cooled below 5° C. by immersion in an ice bath and by the addition of ice to the solution. Sodium nitrite (33.12 g) in water (160 ml) was added with stirring. After 1 hour, excess nitrite was destroyed by the addition of sulphamic acid.

D. Ion Exchange

DBSA paste (300 g) was dissolved in cold water (12) and the diazotised polymer solution from Stage C was slowly poured in. After warming gradually to 25° C. and stirring overnight, the polymer coagulated. The product was collected by filtration, washed thoroughly with cold water and dried in vacuo. Yield 365 g.

EXAMPLE 12

A. Reaction of m-TMI Monomer with Diazo Precursor

EHAA (13.32 g) and dibutyl tin dilaurate (2 drops) were dissolved in NMP (45 ml). To this solution, m-TMI (12.30 g) was slowly added with stirring. Then the mixture was heated to 50° C. and stirred for 3 hours. Ethanol (1 ml) was then added and stirring was continued for a further hour. After this time IR spectroscopy showed that no free isocyanate remained. The solution was then cooled to room temperature.

B. Copolymerisation

A portion of the solution from Stage A (35 ml) was mixed with methyl methacrylate (14.2 g), lauryl methacrylate (5.08 g), methacrylic acid (0.68 g) and AIBN (1.55 g). This solution was then added dropwise over 2 hours to a flask containing NMP (100 ml) at 95° C. A further 3 hour period at 95° C. was allowed after completing the additions. The polymer solution was then cooled to 20° C.

The above solution was added slowly to a refluxing solution of $H_2SO_4$ (10 ml) in water (100 ml). Boiling was continued for 2½ hours and then the reaction mixture was cooled to room temperature.

Samples of the polymer before and after hydrolysis were isolated. IR and NMR spectroscopy showed that there had been no hydrolysis of the ester groups of the methacrylate comonomers.

C. Introduction of the Diazo Group

The hydrolysed polymer solution was cooled below 5° C. by immersion in an ice bath. A solution of sodium nitrite (4.56 g) in water (10 ml) was added with stirring. After 1 hour, excess nitrite was destroyed by the addition of sulphamic acid.

D. Ion Exchange

DBSA paste (20.6 g) was dissolved in cold water (1.2) and the diazotised polymer solution was slowly poured in. After warming gradually to 30° C. and stirring for 30 min., the polymer coagulated. The product was collected by filtration, washed thoroughly with cold water and dried in vacuo. Yield 34.2 g.

EXAMPLE 13

A. Preparation of Terpolymer

NMP (50 ml) was heated to 95° C. (oil bath), under an atmosphere of nitrogen, and a solution containing methyl methacrylate (6.0 g), m-TMI (6.0 g), lauryl methacrylate (2.5 g) and AIBN (0.78 g) in NMP (10.5 ml) was added dropwise over 2 hours. The solution was then stirred at 95° C. for a further 2 hours, and was then cooled to room temperature.

B. Reaction of Terpolymer with Diazo Precursor and Amino-Acid

EHAA (4.0 g), sufficient to react with ⅔ of the available isocyanate groups in the terpolymer, was dissolved in NMP (15 ml) and 1 drop of dibutyl tin dilaurate was added. The terpolymer solution was added to this solution, heated to 50° C., and the mixture was stirred for 3 hours. In order to effect conversion of the remaining isocyanate groups, a solution of 4-aminophenylacetic acid sodium salt (1.7 g) in NMP (10 ml) was added quickly and the mixture was stirred at 50° C. for 2 hours.

The polymer solution was added to a refluxing solution of conc. $H_2SO_4$ (12 g) in water (75 ml) over 5 min. Reflux was maintained for a further 2½ hours to effect hydrolysis.

C. Introduction of Diazo Group

The hydrolysed polymer solution was cooled by the addition of ice (10 g) and was then immersed in an ice bath. With the temperature at 0°–3° C., sodium nitrite (1.66 g) in water (8 ml) was added with stirring. After 1 hour, excess nitrite was destroyed by the addition of sulphamic acid.

D. Ion Exchange

To a solution of DBSA (50 g) in water (2.5) was added the diazo solution obtained from Stage C with stirring. The precipitate was collected by filtration, washed with cold water and dried in vacuo. Yield 20 g.

EXAMPLE 14

Preparation and Processing of Printing Plates

Solutions containing radiation sensitive material based on various diazo polymers formed from EHAA and the monomers set out in the following Table were made up as follows:
Diazo polymer: 3.00 g
Flexo Blue 810: 0.06 g
Methyl ethyl ketone: 100 ml The solutions were whirler coated onto grained and anodised aluminium and the resulting radiation sensitive plates were dried in an oven at 100° C. for 2 min. The plates were then imagewise exposed beneath a continuous tone step-wedge in a vacuum frame and developed with an aqueous solution containing 10% anionic surfactant and 2% benzyl alcohol to obtain lithographic printing plates.

The results are shown in the following Table.

TABLE

| Polymer No. | Prepared as in Example | Ratio of monomers in polymer | | | | | Step-wedge reading | |
|---|---|---|---|---|---|---|---|---|
| | | m-TMI | MM | MAA | LM | SM | Solid | Clear |
| 15 | 8 | 1 | — | — | — | — | 9 | 16 |
| 16 | 10 | 1 | — | — | — | — | 10 | 17 |
| 17 | 11 | 1 | 2 | — | — | — | 7 | 15 |
| 18 | 11 | 1 | — | 2 | — | — | 6 | 15 |
| 19 | 11 | 5 | — | — | — | 1 | 10 | 18 |
| 20 | 11 | 1 | 2 | 2 | — | — | 8 | 16 |
| 21 | 11 | 2 | 7 | 1 | — | — | 6 | 16 |
| 22 | 11 | 3 | 6 | 1 | — | — | 4 | 12 |
| 23 | 12 | 2 | 7 | 1 | — | — | 5 | 14 |
| 24 | 12 | 1 | 7 | 1 | 1 | — | 5 | 15 |
| 25 | 12 | 2 | 6 | 1 | 1 | — | 5 | 12 |
| 26 | 12 | 2 | 3 | 4 | 1 | — | 6 | 15 |
| 27 | 13 | 3 | 6 | 1 | — | — | 4 | 12 |

In the above table, m-TMI is m-isopropyl-α,α-dimethylbenzyl isocyanate, MM is methyl methacrylate, MAA is methacrylic acid, LM is lauryl methacrylate and SM is stearyl methacrylate.

Polymers containing pendant carboxylic acid groups (Nos. 24–27) showed improved development characteristics when incorporated in printing plates. (The carboxylic acid groups in polymer No. 27 are derived from the amino acid used in Stage B). When an aqueous solution of 20% anionic surfactant was used as a developer, polymer No. 23 gave a plate which showed a residual stain after development. However, polymer No. 27 afforded a plate which showed no residual stain. The diazo content of the two polymers, taken as the UV absorbance of a 0.002% w/v solution at 380 nm, was the same (0.43), but polymer No. 27 contained additional carboxylic acid groups.

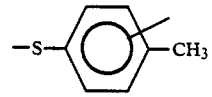

(2)

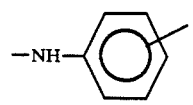

(3)

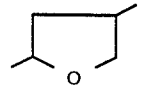

(4)

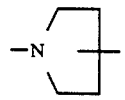

(5)

-continued

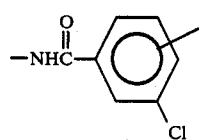 (6)

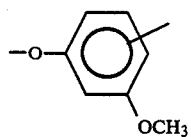 (7)

 (8)

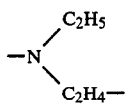 (9)

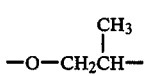 (10)

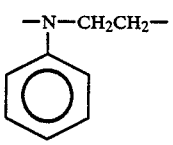 (11)

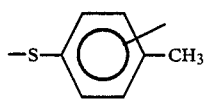

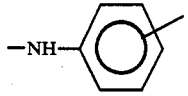

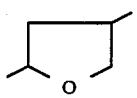

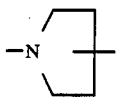

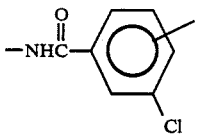

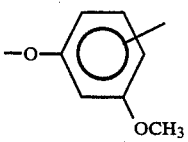

We claim:

1. A radiation sensitive compound which comprises a polymer including a plurality of structural units represented by the formula:

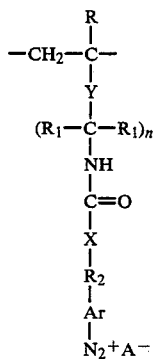

in which, R represents H or CH₃; each R₁, which may be the same or different represents H or alkyl; R₂ represents a single bond or a substituted or unsubstituted divalent radical; Ar represents a substituted or unsubstituted divalent radical derived from an aromatic or heteroaromatic compound; X represents O, S or NH; A represents an anion; Y represents a carbonyl oxy or aromatic radical; and n is an integer equal to or greater than 1.

2. A compound as claimed in claim 1 wherein the radical R₂ has the structure defined by any one of the following formulae:

3. A compound as claimed in claim 1 wherein the radical R₂ contains one or more diazo groups and has the structure

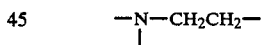

wherein R₃ provides a link with moieties containing said diazo group or groups and is an ethylene, phenylene, succinoyl bis oxy ethyl, methylidene amino or N,N-2,4-tolylene bis carbamoyloxyethyl group or is a single bond when the moiety is a diazodiphenyl group.

4. A compound as claimed in claim 1 wherein the anion A⁻ is p-toluene sulphonate, naphthalene sulphonate, dodecyl benzene sodium sulphonate, dicyclohexylsulphosuccinate, di octyl sulphosuccinate, triisopropyl naphthalene sulphonate diisobutyl naphthalene sulphonate, 2-hydroxy 4 methoxy benzophenone-5-sulphonate, mesitylene sulphonate, octyl phenyl sulphonate, lauryl sulphate, naphthoate, cinnamate, tetrafluoroborate, hexafluorophosphate or reineckate.

5. A compound as claimed in claim 1 wherein the polymer includes units derived from one or more monomeric compounds containing an unsaturated group.

6. A compound as claimed in claim 5 wherein the monomeric compound is a mono (meth)acrylate, (meth)acrylamide, maleic anhydride, an allyl compound, a vinyl compound, a styrene compound., an acrylonitrile compound, an itaconate, or a crotonate.

7. A method of producing a radiation sensitive compound which comprises:

(i) polymerising a compound of the formula

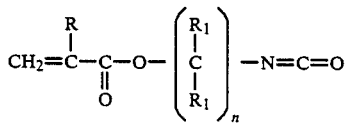

or

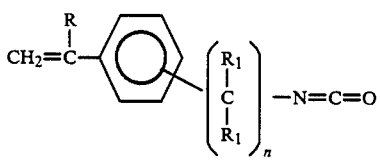

(ii) reacting the isocyanate groups of the resulting polymer with a compound containing a diazo group or diazo group precursor and an —OH, —SH, or —NH$_2$ group, (iii) converting the diazo group precursors as necessary into diazo groups, and (iv) reacting the diazo groups with an acid of the formula HA or with a salt of such acid.

8. A method of producing a radiation sensitive compound which comprises:

(i) reacting a compound of the formula

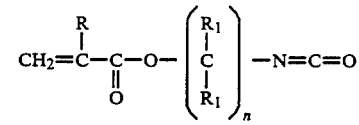

or

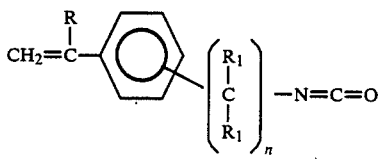

with a compound containing a diazo group or diazo group precursor and an —OH, —SH, or —NH$_2$ group, (ii) polymerising the resulting compound, (iii) converting the diazo group precursors as necessary into diazo groups, and (iv) reacting the diazo groups with an acid of the formula HA or with a salt of such acid.

9. A method according to claim 7 wherein the compound of step (i) is co-polymerised with one or more monomer compounds.

10. A method according to claim 8 wherein the compound containing a diazo group precursor of step (i) is co-polymerised with one or more monomer compounds.

* * * * *